(12) United States Patent
Kim

(10) Patent No.: US 9,543,358 B2
(45) Date of Patent: Jan. 10, 2017

(54) ELECTRONIC DEVICE AND METHOD FOR FABRICATING THE SAME

(71) Applicant: SK hynix Inc., Icheon-Si (KR)

(72) Inventor: Joong-Sik Kim, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 355 days.

(21) Appl. No.: 14/341,694

(22) Filed: Jul. 25, 2014

(65) Prior Publication Data

US 2015/0249154 A1    Sep. 3, 2015

(30) Foreign Application Priority Data

Feb. 28, 2014    (KR) ........................ 10-2014-0024043

(51) Int. Cl.
| | | |
|---|---|---|
| H01L 27/22 | (2006.01) | |
| H01L 29/423 | (2006.01) | |
| H01L 29/78 | (2006.01) | |
| H01L 43/08 | (2006.01) | |
| H01L 45/00 | (2006.01) | |

(Continued)

(52) U.S. Cl.
CPC ......... H01L 27/228 (2013.01); H01L 27/2436 (2013.01); H01L 29/0653 (2013.01); H01L 29/0847 (2013.01); H01L 29/4236 (2013.01); H01L 29/7842 (2013.01); H01L 43/08 (2013.01); H01L 45/04 (2013.01); H01L 45/06 (2013.01); H01L 45/1233 (2013.01); H01L 45/141 (2013.01); H01L 45/146 (2013.01); H01L 45/147 (2013.01)

(58) Field of Classification Search
CPC ............... H01L 27/228; H01L 27/2436; H01L 29/4236; H01L 29/0847; H01L 29/0653; H01L 29/7842; H01L 45/147; H01L 45/141; H01L 45/1233; H01L 45/06; H01L 45/146; H01L 45/04; H01L 43/08; H01L 29/41783; H01L 21/823418; H01L 21/823814; H01L 29/458; H01L 29/78618

USPC ........................................................ 257/211

See application file for complete search history.

(56) References Cited

U.S. PATENT DOCUMENTS 9,105,574 B2 *  8/2015  Song ................... H01L 27/2436
9,178,034 B2 * 11/2015  Fukuda ............. H01L 21/76232
(Continued)

FOREIGN PATENT DOCUMENTS

| KR | 20040044205 A | 5/2004 |
|---|---|---|
| KR | 20060042680 A | 5/2006 |

(Continued)

*Primary Examiner* — Benjamin Sandvik
(74) *Attorney, Agent, or Firm* — Perkins Coie LLP

(57) ABSTRACT

This technology provides an electronic device and a method of fabricating the same. An electronic device in accordance with an implementation of this document includes a transistor comprising a gate where at least a portion of the gate is filled in a semiconductor substrate including an active region defined by an isolation layer; a junction which is disposed over the active region at both side of the gate and includes a metal-containing layer and a first semiconductor layer doped with an impurity and interposed between the active region and the metal-containing layer; and a material layer which is interposed between the junction and the active region to prevent diffusion of the impurity from the first semiconductor layer and defines an opening for coupling the junction to the active region.

20 Claims, 8 Drawing Sheets

(51) Int. Cl.
H01L 27/24 (2006.01)
H01L 29/06 (2006.01)
H01L 29/08 (2006.01)

(56) References Cited

U.S. PATENT DOCUMENTS

| | | | |
|---|---|---|---|
| 9,368,356 B2* | 6/2016 | Kim | H01L 21/283 |
| 9,401,417 B2* | 7/2016 | Chen | H01L 29/401 |
| 2008/0083955 A1* | 4/2008 | Kanarsky | H01L 21/76829 257/382 |

FOREIGN PATENT DOCUMENTS

| | | |
|---|---|---|
| KR | 20100005609 A | 1/2010 |
| KR | 20120122640 A | 11/2012 |

* cited by examiner

ELECTRONIC DEVICE AND METHOD FOR FABRICATING THE SAME

CROSS-REFERENCE TO RELATED APPLICATION

The present application claims priority of Korean Patent Application No. 10-2014-0024043, entitled "ELECTRONIC DEVICE AND METHOD FOR FABRICATING THE SAME" and filed on Feb. 28, 2014, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, in which an electronic device may include a transistor having an excellent characteristic and a semiconductor memory having the transistor and a method of fabricating the same.

In one aspect, an electronic device is provided to include a transistor that includes a gate where at least a portion of the gate is filled in a semiconductor substrate including an active region defined by an isolation layer; a junction which is disposed over the active region at both side of the gate and includes a metal-containing layer and a first semiconductor layer doped with an impurity and interposed between the active region and the metal-containing layer; and a material layer which is interposed between the junction and the active region to prevent diffusion of the impurity from the first semiconductor layer and defines an opening for coupling the junction to the active region. In another aspect, an electronic device is provided to include a transistor that includes a substrate including an active region and an isolation layer which defines the active region; a gate formed on the substrate to include at least a portion of the gate which is filled in the substrate; a junction which is disposed over the active region at both sides of the gate and includes a metal-containing layer and a first semiconductor layer doped with an impurity and interposed between the active region and the metal-containing layer; and a material layer which is interposed between the junction and the active region to prevent diffusion of the impurity from the first semiconductor layer and defines an opening for coupling the junction to the active region.

In some implementations, top surface of the first semiconductor layer is lower than a top surface of the gate. In some implementations, a thickness of the first semiconductor layer is smaller than a thickness of the metal-containing layer. In some implementations, the material layer includes a material which applies a stress to a channel of the transistor. In some implementations, the material layer includes a silicon nitride. In some implementations, the transistor further comprises a metal-semiconductor compound layer interposed between the first semiconductor layer and the metal-containing layer. In some implementations, the transistor further comprises a second semiconductor layer which is formed in the opening and is positioned at a same level as the material layer in a vertical direction. In some implementations, the second semiconductor layer is an epitaxial semiconductor layer. In some implementations, a concentration of the impurity of the first semiconductor layer is higher than that of the second semiconductor layer or the active region. In some implementations, a top surface of the active region is higher than a top surface of the isolation layer in a region where the gate is formed. In some implementations, the electronic device further comprises a memory element which is coupled to the junction disposed at one side of the gate. In some implementations, the memory element includes a variable resistance element which is switched between different resistant states according to an applied voltage or current. In some implementations, the variable resistance element includes a first magnetic layer, a second magnetic layer and a tunnel barrier layer interposed between the first magnetic layer and the second magnetic layer In some implementations, the electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the transistor is part of at least one of the control unit, the operation unit and the memory unit in the microprocessor.

In some implementations, the electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the transistor is part of at least one of the core unit, the cache memory unit and the bus interface in the processor.

In some implementations, the electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the transistor is part of at least one of the processor, the auxiliary memory device, the main memory device and the interface device in the processing system.

In some implementations, the electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the transistor is part of at least one of the controller, the storage device, the temporary storage device and the interface in the data storage system.

In some implementations, the electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the transistor is part of at least one of the memory controller, the memory, the buffer memory and the interface in the memory system.

In another aspect, a method of manufacturing an electronic device comprising a transistor is provided. The method includes providing a substrate including an active region defined by an isolation layer and a stacked structure in which a material layer and a first semiconductor layer doped with an impurity are stacked over the active region; forming a gate trench by etching the first semiconductor layer, the material layer, the active region and the isolation layer in a region where a gate is to be formed; removing a portion of a side of the material layer exposed by the gate trench to form an opening; forming a second semiconductor layer filled in the opening; forming a gate where at least a portion of the gate is filled in the gate trench; removing a portion of the first semiconductor layer; and forming a metal-containing layer in a space which is formed by the removing of the portion of the first semiconductor layer. In another aspect, a method is provided for manufacturing an electronic device comprising a transistor. The method may include providing a substrate including an active region defined by an isolation layer; forming a material layer over the active region; forming a first semiconductor layer doped with an impurity over the material layer; forming a gate trench by etching the first semiconductor layer, the material layer, the active region and the isolation layer; removing a portion of the material layer exposed by the gate trench to form an opening; forming a second semiconductor layer to fill the opening; forming a gate to fill at least a portion of the gate trench; removing a portion of the first semiconductor layer; and forming a metal-containing layer in the removed portion of the first semiconductor layer, wherein the material layer is structured to prevent diffusion of the impurity from the first semiconductor layer.

In some implementations, the removing of the portion of the first semiconductor layer is performed so that a top surface of the first semiconductor layer becomes lower than a top surface of the gate. In some implementations, the forming of the second semiconductor layer is performed by an epitaxial method. In some implementations, the method further comprises forming a metal-semiconductor compound layer between the metal-containing layer and the first semiconductor layer by performing a thermal treatment, after the forming of the metal-containing layer. In some implementations, the method further comprises structuring the material layer to apply a stress to increase the mobility of carriers of the transistor.

In another aspect, an electronic device is provided to include a substrate having an active region defined by an isolation layer; a gate formed over the active region; junctions formed on the active region and at both sides of the gate, each junction including a stack structure including an impurity doped semiconductor pattern and a metal-containing layer, wherein the concentration of an impurity of the impurity doped semiconductor pattern changes a resistance of an interface between the substrate and the junctions; a diffusion barrier layer formed between the active region and the junctions to reduce diffusion of the impurity from the impurity doped semiconductor pattern, the diffusion barrier layer having a structure to apply a stress that increases mobility of charge carriers in a channel formed between the junctions.

In some implementations, the metal-containing layer occupies the greater part of the junction. In some implementations, the impurity doped semiconductor pattern is positioned lower than the top surface of the gate. In some implementations, the electronic device further comprises an opening part formed between the active region and the junctions to electrically couple the active region with the junctions. In some implementations, the electronic device further comprises a memory element for storing data formed on the substrate and coupled to one of the junctions. In some implementations, the memory element includes a magnetic tunneling junction structure. In some implementations, the memory element includes a RRAM (resistive random access memory) element, a PRAM (phase change random access memory) element, an FRAM (ferroelectric random access memory) element, an MRAM (magnetic random access memory) element, or an E-fuse element.

These and other aspects, implementations and associated advantages are described in greater detail in the drawings, the description and the claims.

DETAILED DESCRIPTION

Figure 1:
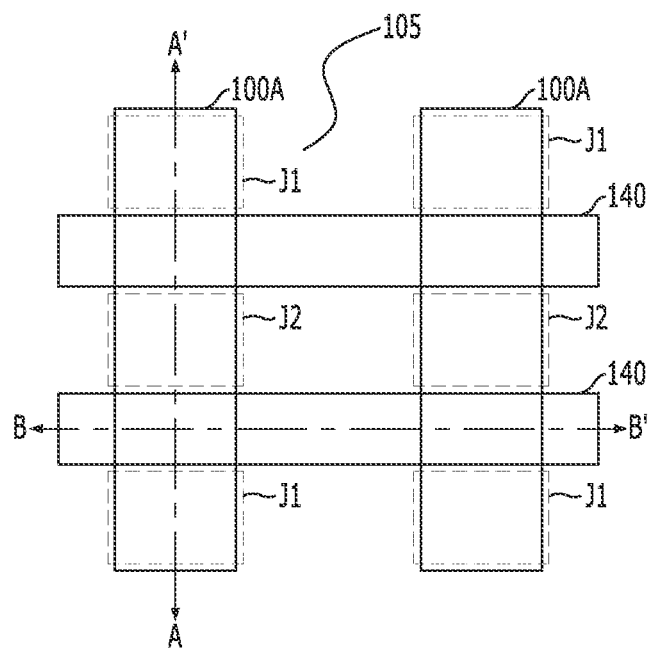
FIGS. 1 to 6 are views explaining a transistor and an example of a method for fabricating the same in accordance with an implementation of the present disclosure.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 4:
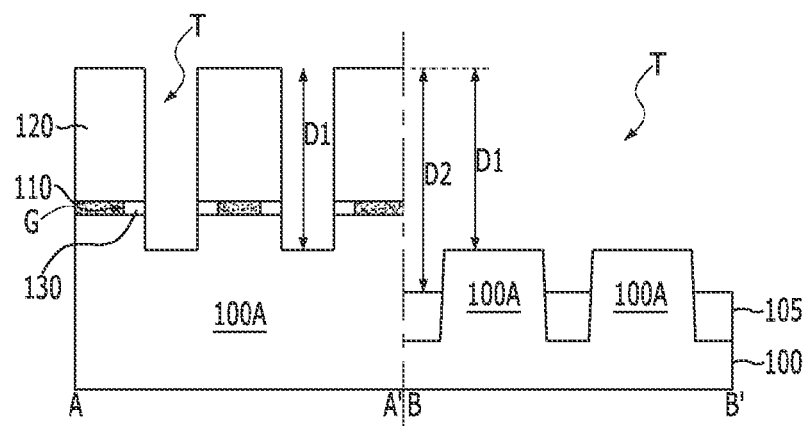
Figure 5:
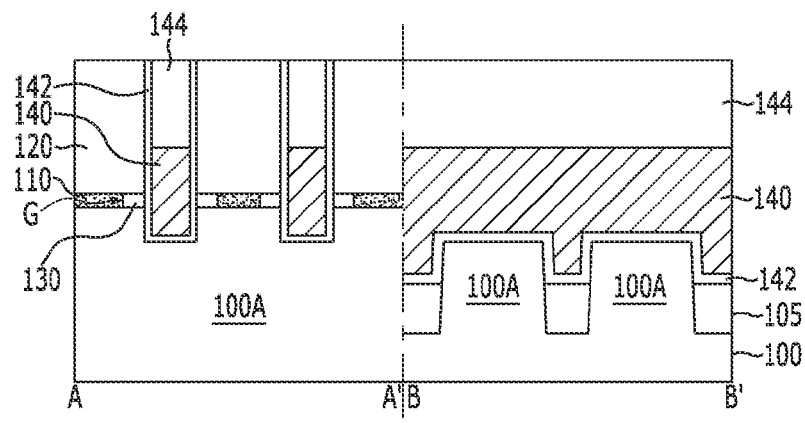
Figure 6:
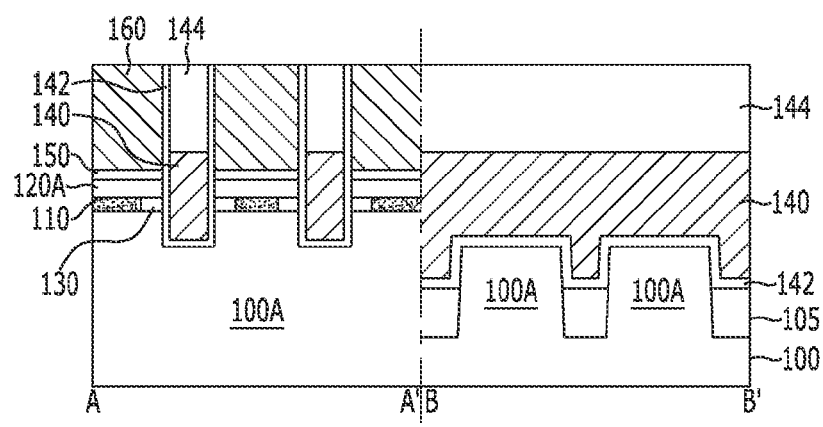

FIGS. 1 to 6 are views illustrating a transistor and explaining an example of a method for fabricating the same in accordance with an implementation of the present disclosure. FIG. 1 is a plan view of the transistor and FIG. 6 is a cross-sectional view taken along lines A-A' and B-B' of FIG. 1. FIGS. 2 to 5 are cross-sectional views showing intermediate processing steps for fabricating the transistor of FIGS. 1 and 6. Following descriptions will be made on a basis of the cross-sectional views and, if necessary, the plan view will be referred together with the cross-sectional views.

First, the fabricating method will be described.

Figure 2:
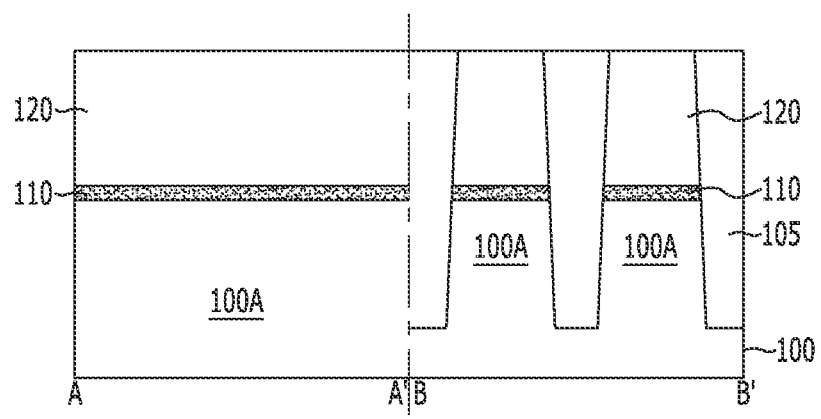

Referring to FIGS. 1 and 2, a semiconductor substrate 100 may be provided. The semiconductor substrate 100 may include various semiconductor materials, such as a silicon.

A material layer 110 and a first semiconductor layer 120 doped with an impurity may be formed over the semiconductor substrate 100.

The material layer 110 may include one or more various materials depending on its function. For example, the material layer 110 may function as a diffusion barrier which prevents or reduces the impurity doped into the first semiconductor layer 120 from diffusing in a region outside the first semiconductor layer 120. In this case, the material layer 110 may include one or more various insulating materials, for example, an oxide such as a silicon oxide, a nitride such as a silicon nitride, or a combination thereof. Alternately, for example, the material layer 110 may function as a stress applying layer which applies a necessary stress to a channel of a transistor in order to increase a mobility of a carrier of the transistor. In this case, the material layer 110 may include one or more various materials such as a silicon nitride which can apply a tensile stress or a compressive stress. In some implementations, the material layer 110 may function as both a diffusion barrier and a stress applying layer at the same time.

The first semiconductor layer 120 may provide a region in which a junction of a transistor is to be formed, and may constitute a portion of the junction. Specifically, the first semiconductor layer 120 may function to decrease a resistance of an interface between the semiconductor substrate 100 and a metal-containing layer included in the junction. The resistance of the interface decreases as a concentration of the impurity doped into the first semiconductor layer 120 increases. Therefore, the first semiconductor layer 120 may contain a high concentration of an impurity. The first semiconductor layer 120 may include one or more various semiconductor materials such as a polysilicon.

The first semiconductor layer 120, the material layer 110 and the semiconductor substrate 100 may be selectively etched to form an isolation trench of a depth D2 which defines an active region 100A of the semiconductor substrate 100, and then, the isolation trench may be filled with one or more various insulating materials to form an isolation layer 105. In this implementation, the active region 100A may extend in a first direction which is parallel to the line A-A', and a plurality of active regions 100A may be arranged in a second direction which is parallel to the line B-B' to be spaced apart from each other. It will be noted that, however, a shape, a number and an arrangement of the active region 100A can be changed in various ways depending on specific requirements of a particular device implementation.

Figure 3:
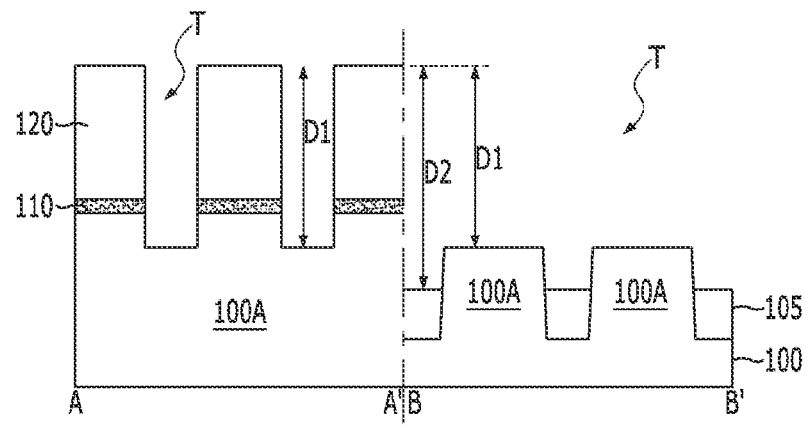

Referring to FIGS. 1 and 3, a gate trench T having a depth D1 which extends in the second direction and crosses the active region 100A may be formed by selectively etching a region in which a gate 140 is to be formed. The first semiconductor layer 120, the material layer 110, the active region 100A and the isolation layer 105 are selectively etched to form a gate trench T. In this implementation, a plurality of gate trenches T may be arranged in the first direction to be spaced apart from each other, and each gate trench T may cross the active regions 100A which are arranged in the second direction. It will be noted that, however, a shape, a number and an arrangement of the gate trench T can be changed in various ways depending on specific requirements of a particular device implementation.

When etching the active region 100A and the isolation layer 105 for forming the gate trench T, the isolation layer 105 may be etched to have a greater depth than the active region 100A. That is, the depth D2 of the gate trench T overlapping with the isolation layer 105 may be greater than the depth D1 of the gate trench T overlapping with the active region 100A. Therefore, the active region 100A may tower over the isolation layer 105 in a region where the gate trench T is formed. For a convenience of description, a portion of the active region 100A which overlaps with the gate trench T and towers over the isolation layer 105 may be referred to as a towering portion of the active region 100A.

Referring to FIGS. 1 and 4, a portion the material layer 110 which is exposed by the gate trench T may be removed to form an opening G. For example, in FIG. 4, the material layer 110 has an opening at the side exposed by the gate trench T. Then, a second semiconductor layer 130 may be formed to fill the opening G.

The forming of the opening G may be performed by an isotropic etching. The second semiconductor layer 130 may be an epitaxial semiconductor layer which is formed by various epitaxial methods such as SPE (Solid Phase Epitaxy). The second semiconductor layer 130 may include a semiconductor material as used for forming the semiconductor substrate 100. The semiconductor material may include, for example, a silicon. The second semiconductor layer 130 and the semiconductor substrate 100 may provide a region where a channel of a transistor is to be formed.

Referring to FIGS. 1 and 5, a gate dielectric layer 142 may be formed along an inner wall of the gate trench T. Then, the gate 140 may be formed to fill a portion of the gate trench T.

The gate 140 may be formed by forming a conductive material such as a metal, a metal nitride, etc., over the resultant structure including the gate dielectric layer 142, and performing an etch-back process until the conductive material has a desired height. While it is explained in this implementation that the gate 140 is filled in a portion of the gate trench T, other limitations are also possible. For example, the gate 140 may be filled in a whole of the gate trench T. Alternately, for example, the gate 140 may fill a whole of the gate trench T and tower over the semiconductor substrate 100.

A top surface of the gate 140 is higher than a bottom surface of the first semiconductor layer 120. Since the gate 140 surrounds the towering portion of the active region 100A under the gate trench T, a contact area between the gate 140 and the active region 100A may increase in the second direction.

A gate protection layer 144 may be formed over the gate 140. When the gate 140 is filled in the portion of the gate trench T as shown in this implementation, the gate protection layer 144 may be disposed over the gate 140 and fill the remaining portion of the gate trench T. The gate protection layer 144 may be formed by forming an insulating material such as an oxide, a nitride, etc, over the resultant structure including the gate 140, and performing a planarization process, for example, CMP (Chemical Mechanical Polishing) until the first semiconductor layer 120 is exposed.

Referring to FIGS. 1 and 6, an upper portion of the first semiconductor layer 120 may be removed by an etch-back process, thereby forming a first semiconductor pattern 120A. A space may be defined over the first semiconductor pattern 120A after removing the upper portion of the first semiconductor layer 120 s. A metal containing layer 160 may be formed in order to fill the space.

The metal-containing layer 160 may include a conductive material which contains a metal and has a low resistance. The metal-containing layer 160 may include a metal layer or a metal compound layer such as a metal oxide layer, a metal nitride layer, a metal borides layer, etc. As one example, in this implementation, the metal-containing layer 160 includes a titanium layer or a titanium nitride layer. The metal-containing layer 160 may also be implemented in other configurations. The metal-containing layer 160 may be formed by forming a metal-containing material over a resultant structure including the first semiconductor pattern 120A, and performing a planarization process until the gate protection layer 144 is exposed.

Then, a metal-semiconductor compound layer 150 may be formed between the metal-containing layer 160 and the first semiconductor pattern 120A by performing a thermal treatment to the resultant structure including the metal-containing layer 160. The metal-semiconductor compound layer 150 may function to prevent or reduce the diffusion between the metal-containing layer 160 and the first semiconductor pattern 120A and thus prevent or reduce the decrease of a resistance of an interface between the metal-containing layer 160 and the first semiconductor pattern 120A. While the metal-semiconductor compound layer 150 of this implementation includes a titanium silicide , other materials may also be used for the metal-semiconductor compound layer 150.

As a result, junctions J1 and J2 may be formed over the active region 100A at both sides of the gate 140. Each junction J1 and J2 includes a stacked structure of the first semiconductor pattern 120A, the metal-semiconductor compound layer 150 and the metal-containing layer 160. The junctions J1 and J2 may include a first junction J1 disposed at one side of the gate 140 and a second junction J2 disposed at the other side of the gate 140. A transistor may be formed with the gate 140 crossing the active region 100A, the first junction J1 disposed at one side of the gate 140 and the second junction J2 disposed at the other side of the gate 140. Although two transistors formed adjacent to each other in the first direction may share the second junction J2 in this implementation, other implementations are also possible.

As a thickness of the first semiconductor pattern 120A in the junctions J1, J2 decrease, an area size occupied by the metal-containing layer 160 and/or the metal-semiconductor compound layer 150 in the junctions J1 and J2 increases, which allows resistances of the junctions J1 and J2 of a transistor to be greatly reduced. Therefore, a thickness of the first semiconductor pattern 120A may be smaller than a thickness of the metal-containing layer 160. Also, a top surface of the first semiconductor pattern 120A may be lower than a top surface of the gate 140.

By the aforementioned processes, the transistor of FIGS. 1 and 6 may be fabricated.

Referring again to FIGS. 1 and 6, the transistor may be formed to include the gate 140 which extends in the second direction and crosses the active region 100A, the junctions J1, J2 which are disposed over the active region 100A at both sides of the gate 140 and includes the stacked structure of the first semiconductor pattern 120A, the metal-semiconductor compound layer 150 and the metal-containing layer 160, and the material layer 110 which is interposed between the active region 100A and the junctions J1 and J2 and defines an opening G for coupling the active region 100A to the junctions J1 and J2. Here, at least a portion of the gate 140 may be filled in the semiconductor substrate 100 including the active region 100A defined by the isolation layer 105. Also, the first semiconductor pattern 120A may be doped with an impurity having a high concentration.

The opening G may contact with both sidewalls of the gate trench T in the first direction, and be filled with the second semiconductor layer 130. That is, the second semiconductor layer 130 may be positioned at the same level as the material layer 110 in a vertical direction to the semiconductor substrate 100. The second semiconductor layer 130 may include an epitaxial semiconductor layer.

By significantly reducing the thickness of the first semiconductor pattern 120A, it is possible to allow the metal-containing layer 160 and/or the metal-semiconductor compound layer 150 to occupy a major portion of the junctions J1 and J2. Under this configuration, a thickness of the first semiconductor pattern 120A may be smaller than a thickness of the metal-containing layer 160, and/or, a top surface of the first semiconductor pattern 120A may be lower than a top surface of the gate 140. In this case, resistances of the junctions J1 and J2 can be significantly reduced.

Also, the first semiconductor pattern 120A may include a high concentration of an impurity. A resistance of an interface between the semiconductor substrate 100 and the junctions J1 and J2 decreases as the concentration of the impurity of the first semiconductor pattern 120A increases. When the concentration of the impurity of the first semiconductor pattern 120A is high, the doped impurity ions may be diffused into the semiconductor substrate 100. This diffusion is undesirable because it may deteriorate the reliability of the transistor by, for example, changing a threshold voltage of the transistor. In this implementation, the material layer 110 interposed between the first semiconductor pattern 120A and the semiconductor substrate 100 can prevent or reduce the diffusion of the doped impurity ions., The concentration of the impurity of the first semiconductor pattern 120A may be higher than a concentration of an impurity of the active region 100A and/or the second semiconductor layer 130.

The region where a channel of the transistor is to be formed is a region between the first junction J1 and the second junction J2 and should not be blocked. Accordingly, the material layer 110 should have the opening G. The channel of the transistor may be formed in the second semiconductor layer 130 and the active region 100A and between the first junction J1 and the second junction J2.

In addition, the material layer 110 may be used to apply a stress to the channel of the transistor to increase a mobility of carriers of the transistor. For example, when the transistor is a NMOS transistor, the material layer 110 may include a material such as a tensile stress silicon nitride, which can apply a tensile stress to the channel. Alternatively, when the transistor is a PMOS transistor, the material layer 110 may include a material such as a compressive stress silicon nitride, which can apply a compressive stress to the channel. It is well known that even the same material, for example, a silicon nitride may apply different levels of stress depending on a fabricating method.

The above implementations may be used to achieve one or more following advantages.

First, since a metal-containing material occupies a major portion of a junction of a transistor, a resistance of the junction may be reduced as compared with transistors in other designs that do not have the disclosed structures in this patent document.

In various other transistor designs, a major portion of a junction of a transistor is occupied by a doping region. The doping region is interposed between a metal-containing layer and a semiconductor substrate, and has a high concentration of an impurity in order to decrease an interfacial resistance between the metal-containing layer and the semiconductor substrate. In this case, the impurity of the doping region is likely to diffuse into the semiconductor substrate, thereby deteriorating a reliability of the transistor. In order to address this problem in other transistor designs, some conventional techniques require the height of the bottom surface of the metal-containing layer and the height of the bottom surface of the doping region to be high. For this reason, in the above conventional techniques, an area occupied by the metal-containing layer in the junction is relatively small.

The transistor designs based on the disclosed technology in this patent document are different. The material layer 110 is provided to function as a diffusion barrier and is interposed between the semiconductor substrate 100 and the junctions J1 and J2, thereby positioning the first semiconductor pattern 120A doped with a high impurity concentration at a relatively lower position. For example, the first semiconductor pattern 120A may be positioned lower than the top surface of the gate 140. Therefore, an area size occupied by the metal-containing layer 160 and/or the metal-semiconductor compound layer 150 in the junctions J1, J2 can be increased.

Further, when the material layer 110 includes a material applying a stress to a channel of a transistor, it is possible to increase a mobility of a carrier of the transistor.

Further, when the active region 100A towers over the isolation layer 105 in a region where the gate 140 is formed, a contact area between the gate 140 and the active region 100A may be increased.

The above features of decreasing a resistance of a junction, increasing a mobility of a carrier and increasing a contact area between a gate and an active region may result in the increase of an operating current of a transistor and improve the operation characteristic of the transistor. Further, since the diffusion of impurities, which are doped in a lowermost region of the junction, into the channel of the transistor is prevented, a reliability of the transistor can be guaranteed. For example, a change of a threshold voltage of the transistor may not occur. .The transistor designs based on the disclosed technology may be used in various electronic devices, for example, a semiconductor memory. The semiconductor memory may include a cell array where memory cells for storing data are arranged. Each of the memory cells may include a memory element for storing data and an access element for controlling an access to the memory element. The above transistor may be used for the access element. Specially, the above transistor may be coupled to a memory element which requires a high operating current, for example, a variable resistance element such as a magneto-resistive element which requires a high current when being switched between a high resistant state and a low resistant state. Hereinafter, this implementation will be exemplarily described.

Figure 7:
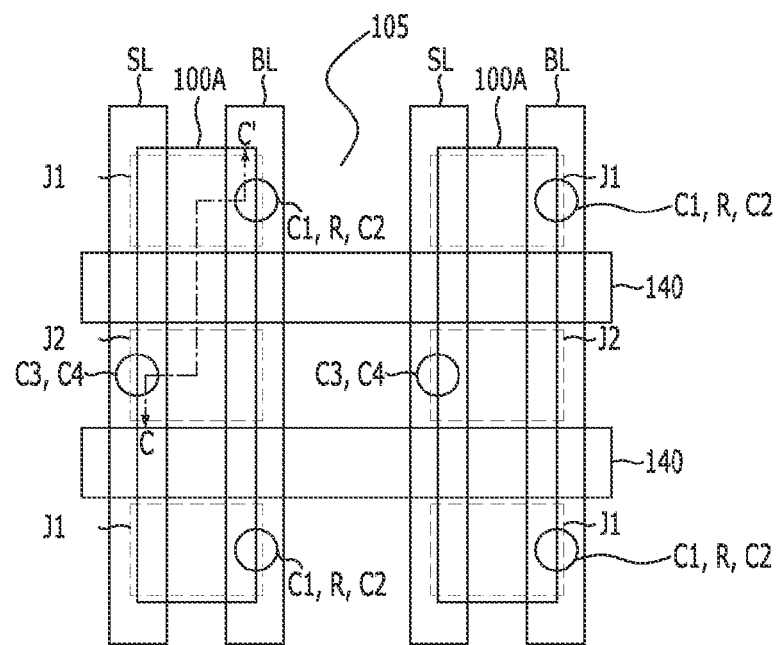
FIG. 7 is a plan view explaining a semiconductor memory in accordance with an implementation of the present disclosure.
Figure 8:
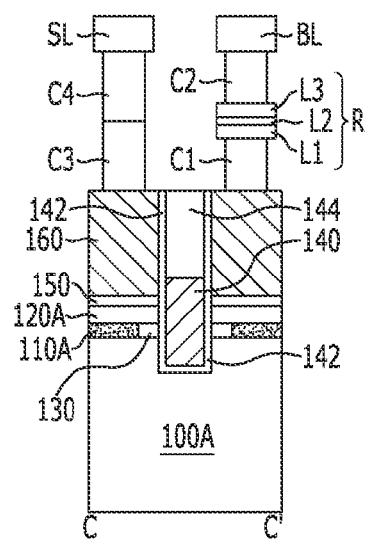
FIG. 8 is a cross-sectional view taken along a line C-C' of FIG. 7.

FIG. 7 is a plan view explaining a semiconductor memory in accordance with an implementation of the present disclosure, and FIG. 8 is a cross-sectional view taken along a line C-C' of FIG. 7.

Referring to FIGS. 7 and 8, the semiconductor memory may include a variable resistance element R which has a bottom end coupled to one of the junctions J1 and J2 of the transistor of FIGS. 1 and 6, a bit line BL coupled to a top end of the variable resistance element R, and a source line SL coupled to the other of the junctions J1 and J2 of the transistor of FIGS. 1 and 6. For example, the variable resistance element R is coupled to the first junction J1 which is disposed at both sides of two gates 140 arranged adjacent to each other in the first direction, and the source line SL is coupled to the second junction J2 which is disposed between the two gates 140.

The variable resistance element R may be coupled to the first junction J1 through a first contact C1, and the bit line BL may be coupled to the variable resistance element R through a second contact C2. The source line SL may be coupled to the second junction J2 through a third contact C3 and a fourth contact C4. The first to fourth contacts C1, C2, C3, C4 may penetrate through an interlayer dielectric layer (now shown). The first contact C1 and the third contact C3 may be formed by the same process. For example, the contacts C1 and C3 may be formed through an etching process using a same mask and a filling process filling a conductive material. Similarly, the second contact C2 and the fourth contact C4 may be formed by the same process.

The first stacked structure of the first contact C1, the variable resistance element R, the second contact C2 and the bit line BL may be disposed over one side of the active region 100A in the second direction. For example, the first stacked structure may be arranged in the right side of the active region 100A. The second stacked structure of the third contact C3, the fourth contact C4 and the source line SL may be disposed over the other side of the active region 100A in the second direction. For example, the second stacked structure may be arranged in the left side of the active region 100A. In this case, between a first stacked structure of the first contact C1, the variable resistance element R, the second contact C2 and the bit line BL and a second stacked structure of the third contact C3, the fourth contact C4 and the source line SL, a sufficient distance may be obtained, thereby preventing an electrical bridge or short between the first stacked structure and the second stacked structure.

The variable resistance element R may be switched between different resistant states according to an applied voltage or current through the transistor coupled to the bottom end of the variable resistance element R and the bit line BL coupled to the top end of the variable resistance element R. The variable resistance element R may be formed as a single layer or multiple layers including various materials which are used an RRAM, a PRAM, an FRAM, an MRAM, etc, for example, a metal oxide such as a transition metal oxide or a perovskite-based material, a phase change material such as a chalcogenide-based material, a ferroelectric material, a ferromagnetic material, etc. The variable resistance element R may store different data depending on resistant states.

In this implementation, the variable resistance element R may include MTJ (Magnetic Tunnel Junction) structure including a first magnetic layer L1, a tunnel barrier layer L2 and a second magnetic layer L3. In this case, one of the first magnetic layer L1 and the second magnetic layer L3 may be a pinned layer having a pinned magnetization direction, and the other thereof may be a free layer having a variable magnetization direction. The first magnetic layer L1 and the second magnetic layer L2 may be formed of a single layer or a multiple layer including a ferromagnetic material, for example, an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, etc. The tunnel barrier layer L2 may change the magnetization direction of the free layer by the tunneling of electrons. The tunnel barrier layer L2 may be formed as a single layer or multiple layers including an oxide such as MgO, CaO, SrO, TiO, VO, NbO, etc. When the magnetization directions of the free layer and the pinned layer are parallel to each other, the variable resistance element R may exhibit a low resistant state, and, when the magnetization directions of the free layer and the pinned layer are anti-parallel to each other, the variable resistance element R may exhibit a high resistant state. Here, a relatively high current is required to change the magnetization direction of the free layer, and the transistor of this implementation may satisfy this requirement.

However, other implementations may be possible. Instead of the variable resistance element R, various memory elements for storing data, for example, a capacitor may be coupled to one end of the transistor.

By using the transistor with improved characteristics including, for example, an increased operating current, an operating characteristic of the semiconductor memory may be also improved.

The above and other memory circuits or semiconductor devices based on the disclosed technology can be used in a range of devices or systems. FIGS. 9-13 provide some examples of devices or systems that can implement the memory circuits disclosed herein.

Figure 9:
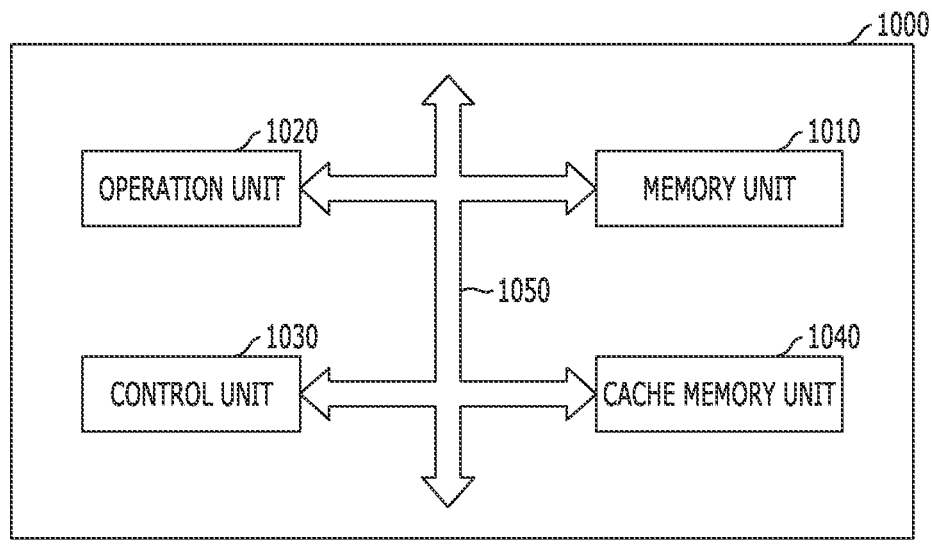
FIG. 9 is an example of configuration diagram of a microprocessor implementing memory circuitry based on the disclosed technology.

FIG. 9 is an example of configuration diagram of a microprocessor implementing memory circuitry based on the disclosed technology.

Referring to FIG. 9, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

At least one of the memory unit 1010, the operation unit 1020 and the control unit 1030 may include one or more of the above-described semiconductor devices in accordance with the implementations. For example, at least one of the memory unit 1010, the operation unit 1020 and the control unit 1030 may include a transistor comprising a gate where at least a portion of the gate is filled in a semiconductor substrate including an active region defined by an isolation layer; a junction which is disposed over the active region at both side of the gate and includes a metal-containing layer and a first semiconductor layer doped with an impurity and interposed between the active region and the metal-containing layer; and a material layer which is interposed between the junction and the active region to prevent diffusion of the impurity from the first semiconductor layer and defines an opening for coupling the junction to the active region. Through this, operating characteristics of at least one of the memory unit 1010, the operation unit 1020 and the control unit 1030 may be improved. As a consequence, operating characteristics of the microprocessor 1000 may be improved.

Figure 10:
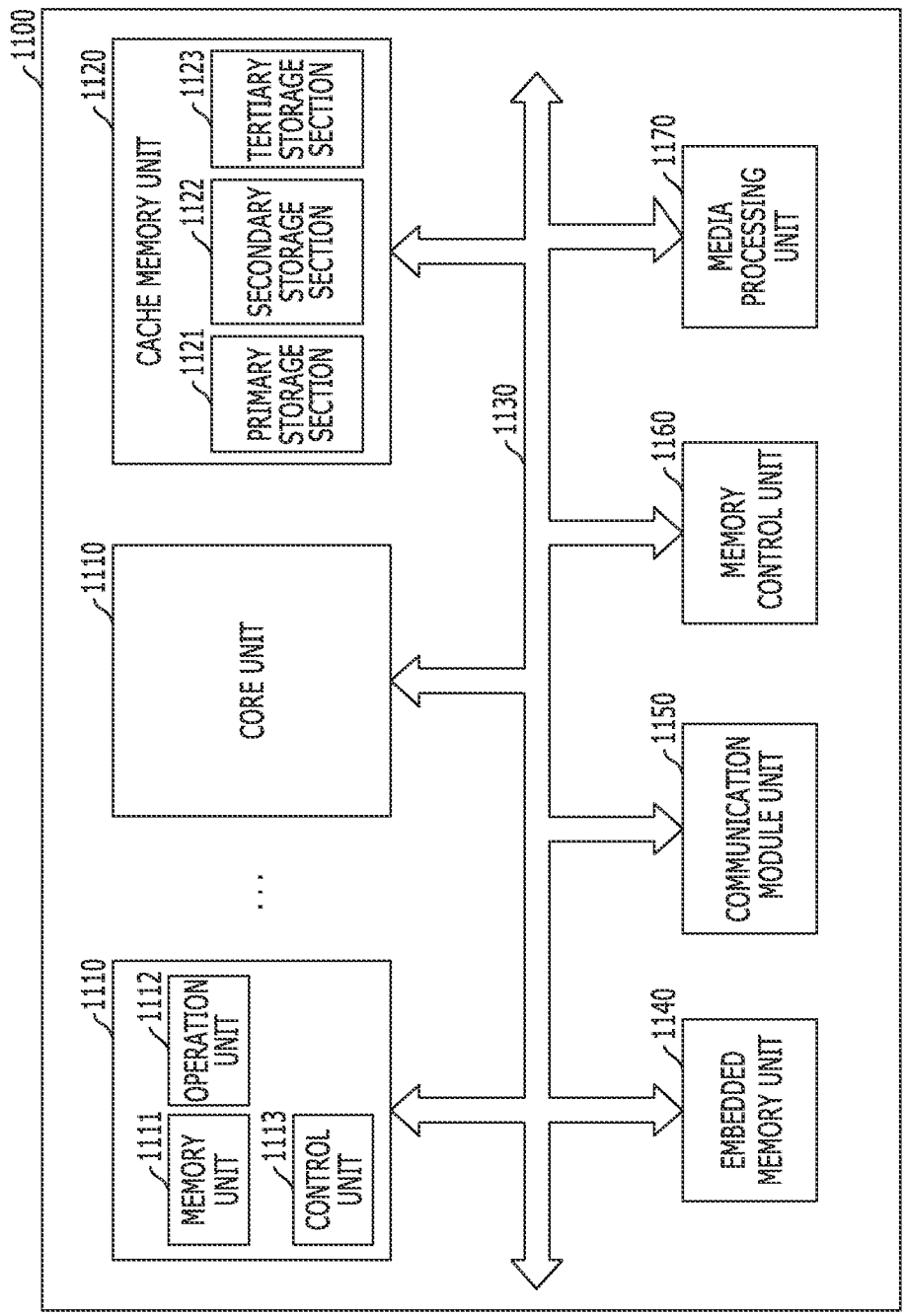
FIG. 10 is an example of configuration diagram of a processor implementing memory circuitry based on the disclosed technology.

FIG. 10 is an example of configuration diagram of a processor implementing memory circuitry based on the disclosed technology.

Referring to FIG. 10, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest.

Although it was shown in FIG. 10 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device.

Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120.

The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

At least one of the cache memory unit 1120, the core unit 1110 and the bus interface 1130 may include one or more of the above-described semiconductor devices in accordance with the implementations. For example, at least one of the cache memory unit 1120, the core unit 1110 and the bus interface 1130 may include a transistor comprising a gate where at least a portion of the gate is filled in a semiconductor substrate including an active region defined by an isolation layer; a junction which is disposed over the active region at both side of the gate and includes a metal-containing layer and a first semiconductor layer doped with an impurity and interposed between the active region and the metal-containing layer; and a material layer which is interposed between the junction and the active region to prevent diffusion of the impurity from the first semiconductor layer and defines an opening for coupling the junction to the active region. Through this, operating characteristics of at least one of the cache memory unit 1120, the core unit 1110 and the bus interface 1130 may be improved. As a consequence, operating characteristics of the processor 1100 may be improved.

Figure 11:
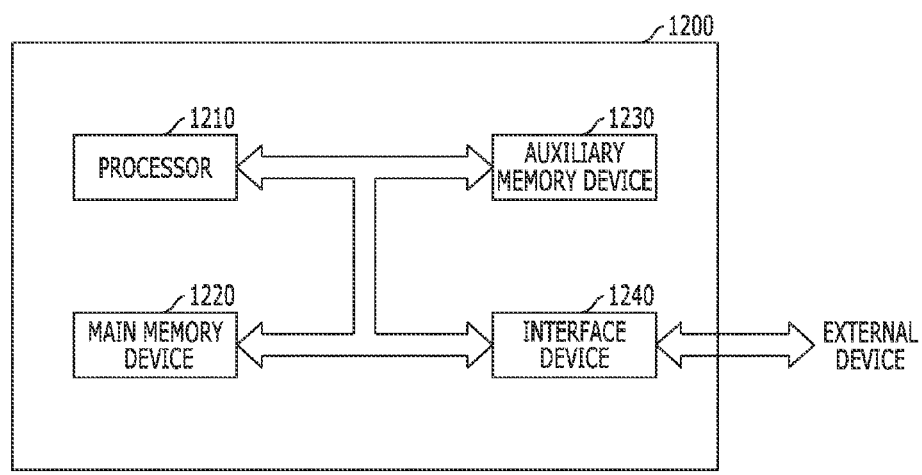
FIG. 11 is an example of configuration diagram of a system implementing memory circuitry based on the disclosed technology.

FIG. 11 is an example of configuration diagram of a system implementing memory circuitry based on the disclosed technology.

Referring to FIG. 11, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

At least one of the processor 1210, the main memory device 1220, the auxiliary memory device 1230 and the interface device 1240 may include a transistor comprising a gate where at least a portion of the gate is filled in a semiconductor substrate including an active region defined by an isolation layer; a junction which is disposed over the active region at both side of the gate and includes a metal-containing layer and a first semiconductor layer doped with an impurity and interposed between the active region and the metal-containing layer; and a material layer which is interposed between the junction and the active region to prevent diffusion of the impurity from the first semiconductor layer and defines an opening for coupling the junction to the active region. Through this, operating characteristics of at least one of the processor 1210, the main memory device 1220, the auxiliary memory device 1230 and the interface device 1240 may be improved. As a consequence, operating characteristics of the system 1200 may be improved.

Figure 12:
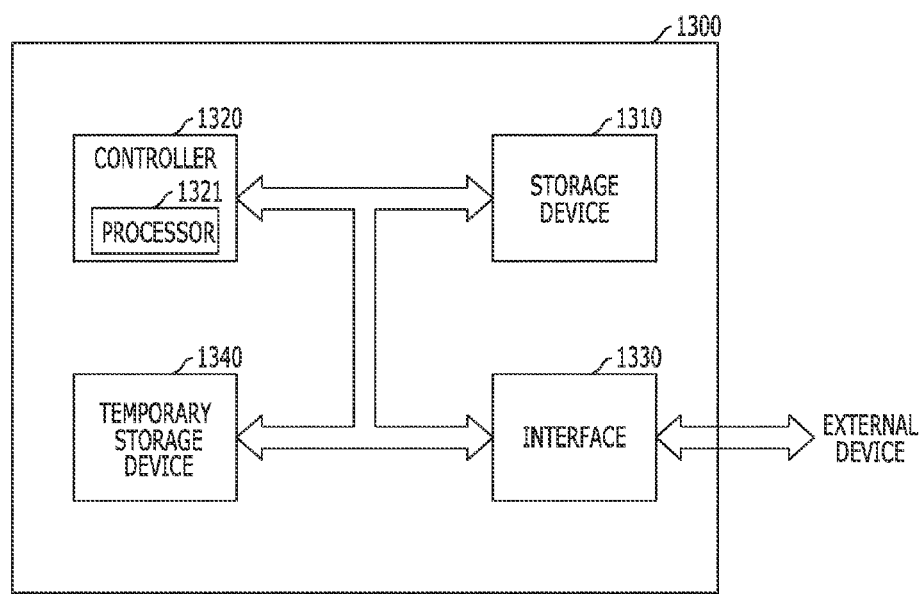
FIG. 12 is an example of configuration diagram of a data storage system implementing memory circuitry based on the disclosed technology.

FIG. 12 is an example of configuration diagram of a data storage system implementing memory circuitry based on the disclosed technology.

Referring to FIG. 12, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system.

At least one of the storage device 1310, the controller 1320, the interface 1330 and the temporary storage device 1340 may include one or more of the above-described semiconductor devices in accordance with the implementations. For example, at least one of the storage device 1310, the controller 1320, the interface 1330 and the temporary storage device 1340 may include a transistor comprising a gate where at least a portion of the gate is filled in a semiconductor substrate including an active region defined by an isolation layer; a junction which is disposed over the active region at both side of the gate and includes a metal-containing layer and a first semiconductor layer doped with an impurity and interposed between the active region and the metal-containing layer; and a material layer which is interposed between the junction and the active region to prevent diffusion of the impurity from the first semiconductor layer and defines an opening for coupling the junction to the active region. Through this, operating characteristics of at least one of the storage device 1310, the controller 1320, the interface 1330 and the temporary storage device 1340 may be improved. As a consequence, operating characteristics of the data storage system 1300 may be improved.

Figure 13:
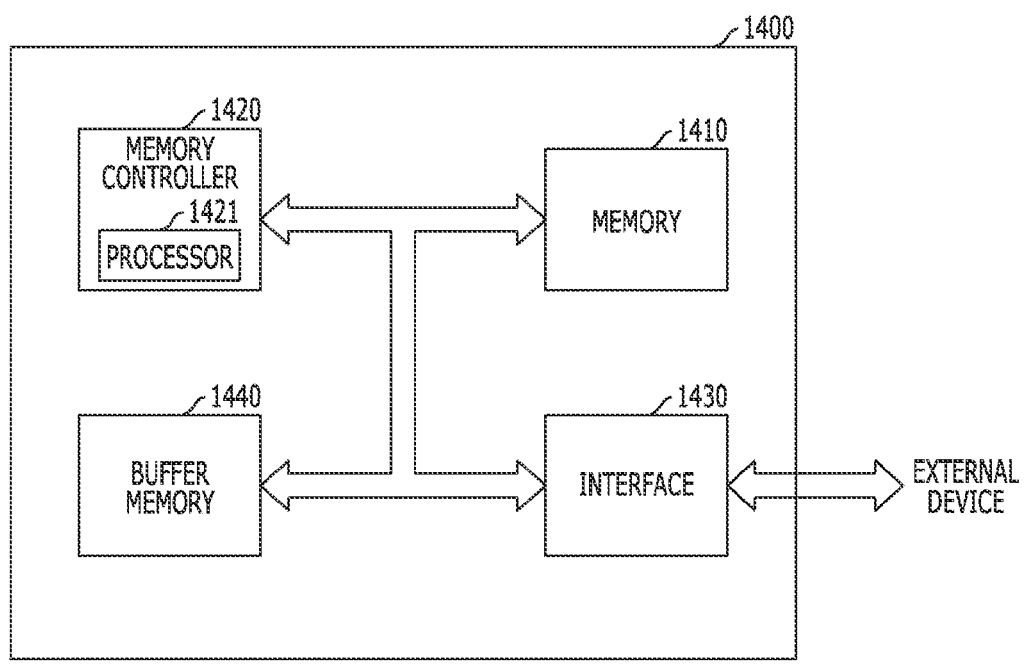
FIG. 13 is an example of configuration diagram of a memory system implementing memory circuitry based on the disclosed technology.

FIG. 13 is an example of configuration diagram of a memory system implementing memory circuitry based on the disclosed technology.

Referring to FIG. 13, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

At least one of the memory 1410, the memory controller 1420, the interface 1430 and the buffer memory 1440 may include one or more of the above-described semiconductor devices in accordance with the implementations. For example, at least one of the memory 1410, the memory controller 1420, the interface 1430 and the buffer memory 1440 may include a transistor comprising a gate where at least a portion of the gate is filled in a semiconductor substrate including an active region defined by an isolation layer; a junction which is disposed over the active region at both side of the gate and includes a metal-containing layer and a first semiconductor layer doped with an impurity and interposed between the active region and the metal-containing layer; and a material layer which is interposed between the junction and the active region to prevent diffusion of the impurity from the first semiconductor layer and defines an opening for coupling the junction to the active region. Through this, operating characteristics of at least one of the memory 1410, the memory controller 1420, the interface 1430 and the buffer memory 1440 may be improved. As a consequence, operating characteristics of the memory system 1400 may be improved.

Features in the above examples of electronic devices or systems in FIGS. 9-13 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a transistor, wherein the transistor comprises:
   a substrate including an active region and an isolation layer which defines the active region;
   a gate formed on the substrate to include at least a portion of the gate which is filled in the substrate;
   a junction which is disposed over the active region at both sides of the gate and includes a metal-containing layer and a first semiconductor layer doped with an impurity and interposed between the active region and the metal-containing layer; and a material layer which is interposed between the junction and the active region to prevent diffusion of the impurity from the first semiconductor layer and defines an opening for coupling the junction to the active region.

2. The electronic device of claim 1, wherein a top surface of the first semiconductor layer is lower than a top surface of the gate.

3. The electronic device of claim 1, wherein a thickness of the first semiconductor layer is smaller than a thickness of the metal-containing layer.

4. The electronic device of claim 1, wherein the material layer includes a material which applies a stress to a channel of the transistor.

5. The electronic device of claim 1, the material layer includes a silicon nitride.

6. The electronic device of claim 1, further comprising:
a metal-semiconductor compound layer interposed between the first semiconductor layer and the metal-containing layer.

7. The electronic device of claim 1, further comprising:
a second semiconductor layer which is formed in the opening and is positioned at a same level as the material layer in a vertical direction.

8. The electronic device of claim 7, wherein the second semiconductor layer is an epitaxial semiconductor layer.

9. The electronic device of claim 7, wherein a concentration of the impurity of the first semiconductor layer is higher than that of the second semiconductor layer or the active region.

10. The electronic device of claim 1, a top surface of the active region is higher than a top surface of the isolation layer in a region where the gate is formed.

11. The electronic device of claim 1, further comprising:
a memory element which is coupled to the junction disposed at one side of the gate.

12. The electronic device of claim 11, wherein the memory element includes a variable resistance element which is switched between different resistance states according to an applied voltage or current.

13. The electronic device of claim 12, wherein the variable resistance element includes a first magnetic layer, a second magnetic layer and a tunnel barrier layer interposed between the first magnetic layer and the second magnetic layer.

14. The electronic device according to claim 1, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the transistor is part of at least one of the core unit, the cache memory unit and the bus interface in the processor.

15. The electronic device according to claim 1, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between at least one of the processor, the auxiliary memory device and the main memory device and the outside,
wherein the transistor is part of at least one of the processor, the auxiliary memory device, the main memory device and the interface device in the processing system.

16. An electronic device comprising:
a substrate having an active region defined by an isolation layer;
a gate formed over the active region;
junctions formed on the active region and at both sides of the gate, each junction including a stack structure including an impurity doped semiconductor pattern and a metal-containing layer, wherein the concentration of an impurity of the impurity doped semiconductor pattern changes a resistance of an interface between the substrate and the junctions;
a diffusion barrier layer formed between the active region and the junctions to reduce diffusion of the impurity from the impurity doped semiconductor pattern, the diffusion barrier layer having a structure to apply a stress that increases mobility of charge carriers in a channel formed between the junctions.

17. The electronic device of claim 16, wherein the metal-containing layer occupies the greater part of the junction.

18. The electronic device of claim 16, wherein the impurity doped semiconductor pattern is positioned lower than the top surface of the gate.

19. The electronic device of claim 16, further comprising:
an opening part formed between the active region and the junctions to electrically couple the active region with the junctions.

20. The electronic device of claim 16, further comprising:
a memory element for storing data formed on the substrate and coupled to one of the junctions.

* * * * *